United States Patent [19]

Arrasmith et al.

[11] 4,376,796
[45] Mar. 15, 1983

[54] PROCESSING SILICON WAFERS EMPLOYING PROCESSING GAS ATMOSPHERES OF SIMILAR MOLECULAR WEIGHT

[75] Inventors: Robert D. Arrasmith, Santa Ana; Thomas R. Barnhart, Yorba Linda; Jon C. Goldman, Orange, all of Calif.

[73] Assignee: Thermco Products Corporation, Orange, Calif.

[21] Appl. No.: 315,572

[22] Filed: Oct. 27, 1981

[51] Int. Cl.³ .......................................... H01L 21/316
[52] U.S. Cl. .................................... 427/82; 427/93; 427/95
[58] Field of Search ................. 427/93, 82, 95; 148/1.5

[56] References Cited

U.S. PATENT DOCUMENTS

| | | | |
|---|---|---|---|
| 2,820,760 | 8/1957 | Derick | 148/1.5 |
| 3,243,314 | 3/1966 | Lehman . | |
| 3,426,422 | 2/1969 | Deal | 29/571 |
| 3,518,115 | 6/1970 | Pammer . | |
| 3,594,227 | 7/1971 | Oswald | 148/175 |
| 3,647,535 | 3/1972 | Naber . | |
| 3,692,571 | 9/1972 | Colton . | |
| 3,903,325 | 9/1975 | Horiuchi | 427/93 |
| 4,018,184 | 4/1977 | Nagasawa | 118/49.1 |
| 4,139,658 | 2/1979 | Cohen | 427/93 |
| 4,154,192 | 5/1979 | Tsubouchi | 118/49.1 |
| 4,167,915 | 9/1979 | Toole | 427/93 |
| 4,214,919 | 7/1980 | Young | 427/93 |
| 4,253,417 | 3/1981 | Valentijn | 118/733 |
| 4,268,538 | 5/1981 | Toole | 427/93 |
| 4,275,094 | 6/1981 | Takagi | 427/93 |
| 4,293,589 | 10/1981 | Takagi | 427/93 |
| 4,293,590 | 10/1981 | Takagi | 427/93 |

FOREIGN PATENT DOCUMENTS 52-154360 12/1977 Japan .

OTHER PUBLICATIONS

Zeto et al., "Pressure Oxidation of Silicon: An Emerging Technology", *Solid State Technology*, Jul. 1979, pp. 62-69.
Ga Sonics Products Specifications, 5624-3/11/78, 3k, "High Pressure Oxidation System", Mar. 1978,
Tsybouchi et al., "Oxidation of Silicon in High Pressure Steam", *Japan J. App. Phys.*, vol. 16, No. 5, 1977, pp. 855-856.
Irene, "Method to Reduce Defects in Very Thin $SiO_2$ Films", *IBM TDB*, vol. 21, No. 1, Jun. 1978, pp. 393-394.

*Primary Examiner*—John D. Smith
*Attorney, Agent, or Firm*—George R. Clark; Neil M. Rose; Robert J. Fox

[57] ABSTRACT

At atmosphere X and an atmosphere Y, which may be an oxidizing atmosphere, are used in a process wherein silicon wafers are processed in a processing chamber, which is pressurized sequentially with a purging atmosphere, with the atmosphere X, and with the atmosphere Y displacing the atmosphere X excpet for a residual portion remaining with the atmosphere X and diminishing in concentration with time. As the atmosphere X has a molecular weight approximating the molecular weight of the atmosphere Y, stratification is minimized. If the atmosphere Y is steam, the atmosphere X may be a premixture of helium and oxyen.

25 Claims, 1 Drawing Figure

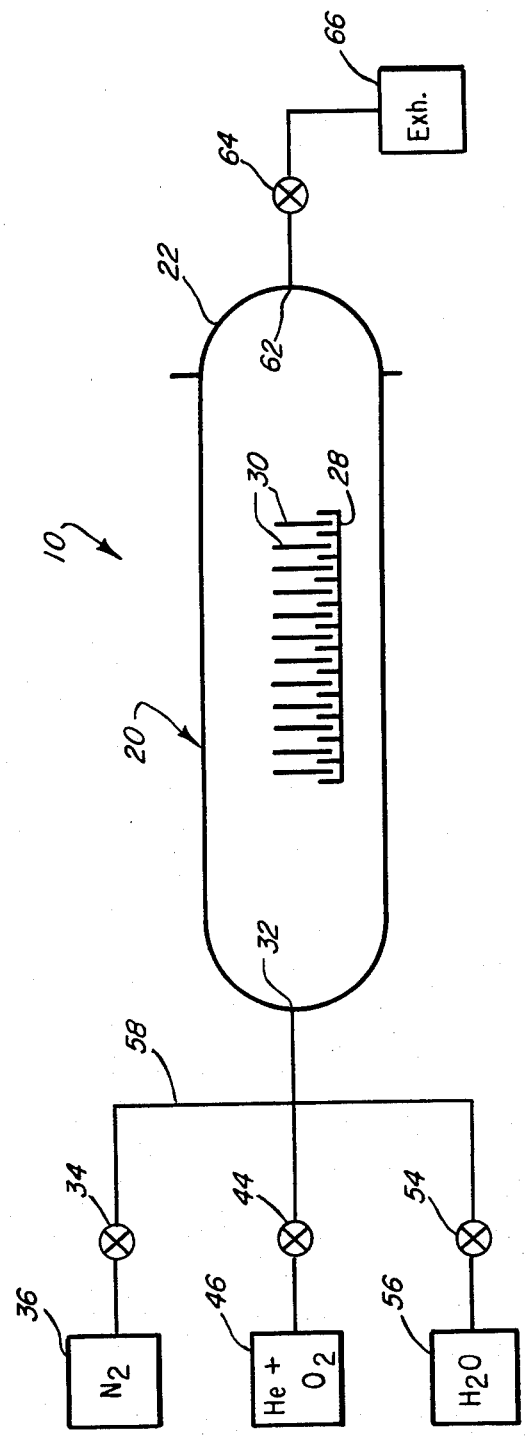

PROCESSING SILICON WAFERS EMPLOYING PROCESSING GAS ATMOSPHERES OF SIMILAR MOLECULAR WEIGHT

BACKGROUND OF THE INVENTION

This invention pertains to a process wherein silicon wafers are processed in a processing chamber, which is pressurized sequentially with different atmospheres, particularly but not exclusively in oxidation of silicon wafers at high temperatures and high pressures.

It is known for silicon wafers to be oxidized by a process known as thermal oxidation and practiced at high temperatures, which typically may range from 700° to 1,000° C., and at high pressures, which typically may range from 5 to 25 atmospheres, in a tubular vessel, which has a removable closure. Typically, the tubular vessel is flooded preliminarily with a purging atmosphere as silicon wafers, which are disposed edgewise and uprightly on a boat, are loaded into the tubular vessel, whereupon the tubular vessel is pressurized to a processing pressure with a series of different processing atmospheres, each processing atmosphere displacing a preceding atmosphere except for a residual portion remaining with such processing atmosphere and diminishing in concentration with time.

In a typical case, the purging atmosphere is or comprises nitrogen, which may be regarded as inert under these conditions although there are some indications of its reactivity under these conditions, one of the processing atmospheres is or comprises dry oxygen, which is a slow oxidizer, and another of the processing atmospheres is or comprises steam, which is a fast oxidizer. In the same case, dry oxygen can be introduced initially at a fast rate, so as to promote displacement of the purging atmosphere of nitrogen, and subsequently at a slow rate once the purging atmosphere essentially has been displaced, so as to conserve dry oxygen. Dry oxygen effects slow formation of a thin film of silicon dioxide on the wafers. Next, steam may be introduced at a slow rate, which is limited by physical constraints of available apparatus, so as to effect fast formation of the thin film of silicon dioxide. Also, steam may be followed by dry oxygen, which may be followed by nitrogen, whereupon the tubular vessel may be depressurized.

One type of known apparatus, in which the process described above for thermal oxidation of silicon wafers can be practiced, is disclosed in U.S. Pat. No. 4,253,417, wherein the tubular vessel is enclosed within an outer vessel, which is pressurized outside the tubular vessel, so as to equalize the pressures outside and inside the tubular vessel except for a small differential so that leakage of the tubular vessel is leakage out, whereby the tubular vessel may be made of quartz, silicon, or other fragile material. Other types of known apparatus, in which similar processes can be practiced, are disclosed in U.S. Pat. No. 4,018,184 and U.S. Pat. No. 4,167,915.

In the process described above for thermal oxidation of silicon wafers, as practiced before this invention, nonuniform oxidation of the wafers has been a problem of serious magnitude. It has been found that the thin films of silicon dioxide formed on the wafers when the wafers are disposed edgewise and uprightly in the oxidizing atmosphere have observable gradients of thickness from thicker portions at upper edges of the wafers to thinner portions at lower edges of the wafers. Also, the problem is exacerbated at higher pressures (20 to 25 atmospheres) among the high pressures (5 to 25 atmospheres) discussed above, and at lower temperatures (700° to 800° C.) among the high temperatures (700° to 1000° C.) discussed above.

Because the process is thermally activated, whereupon the process proceeds more rapidly at higher temperatures and less rapidly at lower temperatures, prior efforts to deal with the problem have been directed to improved insulating, baffling, and heating measures, by which it has been found that nonuniformity of the temperature of the oxidizing atmosphere enveloping the wafers can be reduced, controlled, or eliminated, so as to alleviate the problem. The temperature of the oxidizing atmosphere at the upper and lower reaches of the tubular vessel can be measured nonintrusively by thermocouples arrayed on the tubular vessel.

However, it has been found that the problem can be alleviated but cannot be eliminated solely by such measures, as it has been found that the thin films of silicon dioxide formed on the wafers are thicker at upper edges of the wafers and thinner at lower edges of the wafers, even if the temperature of the oxidizing atmosphere enveloping the wafers is uniform at the upper and lower edges of the wafers, and even if the temperature of the oxidizing atmosphere is hotter at lower edges of the wafers and cooler at upper edges of the wafers.

Other efforts to deal with the problem have been directed to means to promote turbulent flow of the oxidizing atmosphere. However, turbulent flow of the oxidizing atmosphere may be difficult to accomplish effectively, particularly if the oxidizing atmosphere is or comprises steam at high pressures.

For a constant volume of an ideal gas, the density of the gas is proportional to the number of molecules of the gas and to the molecular weight of the gas. For constant pressure, volume, and temperature, the number of molecules of the gas is independent of the species of the gas. Thus, the density of the gas is proportional to the molecular weight of the gas at constant pressure, volume, and temperature. Thus, the density of a mixture of two, three, or more gases at constant pressure, volume, and temperature is proportional to the sum of the respective products of the molecular weights and the mole fractions of its components.

Herein, all molecular weights are stated in round numbers, whenever stated. Herein, the molecular weight of a particular atmosphere being one gas refers to its molecular weight, and the molecular weight of a particular atmosphere being a mixture of gases refers to mean molecular weight of the mixture.

SUMMARY OF THE INVENTION

This invention stems from a discovery that, in oxidation of silicon wafers by the process described above, nonuniformity of oxidation is due not only to nonuniformity of temperature, as discussed above, but also to stratification of the gases in the processing chamber when an atmosphere of a given density displaces an atmosphere of a different density except for a residual portion remaining with the atmosphere of the given density and diminishing in concentration with time, particularly if the different density is lower than the given density, and particularly if turbulent flow is not achieved. Thus, it has been concluded that stratification of steam and oxygen causes a stratum of steam, which has a molecular weight of 18, to form over a stratum of oxygen, which has a molecular weight of 32, when an oxidizing atmosphere of steam displaces a preceding atmosphere of oxygen except for a residual portion of oxygen remaining with the oxidizing atmosphere of steam and diminishing in concentration with time, whereupon the stratum of steam oxidizes the wafers quickly as the stratum of oxygen oxidizes the wafers slowly. Also, it has been concluded that there is a changing boundary between the strata, until oxygen essentially has been displaced, so as to account for the gradients of thickness.

Accordingly, this invention is directed to an improvement in a process wherein silicon wafers are processed in a processing chamber, which is pressurized to a given pressure with an atmosphere X, and wherein an atmosphere Y at the same pressure displaces the atmosphere X except for a residual portion remaining with the atmosphere X and diminishing in concentration with time. Particularly but not exclusively, the process may be a process wherein the atmosphere Y is an oxidizing atmosphere, which is or comprises steam.

Broadly, this invention is directed to the improvement wherein the atmosphere X has a molecular weight approximating the molecular weight of the atmosphere Y, whereby stratification of gases in the processing chamber is minimized. Thus, the density of the atmosphere X approximates the density of the atmosphere Y at constant volume, pressure, and temperature.

As mentioned above, the atmosphere Y may be an oxidizing atmosphere, which is or comprises steam. If the atmosphere Y is steam, it thus has a molecular weight of 18. As compared to dry oxygen, which is a slow oxidizer, steam is a fast oxidizer.

The atmosphere X may be composed of one gas of a molecular weight approximating the molecular weight of the atmosphere Y or two, three, or more (plural) gases in a premixture of mean molecular weight approximating the molecular weight of the atmosphere Y. Mean molecular weight equals the sum of the respective products of the molecular weights and the mole fractions of the components of the mixture.

If composed of plural gases of disparate molecular weights (differing by 5 or more atomic mass units) that are not reactive with each other under the conditions found in the processing chamber, the atmosphere X must be premixed, so as to avoid stratification of its gases. If its gases were to be introduced separately, whether concurrently or sequentially, stratification of its gases otherwise could occur. When premixed, its gases reach their states of highest entropy, at which the gases do not unmix.

Analogously, if the processing atmosphere is composed of plural gases of disparate molecular weights that are not reactive with each other under the conditions found in the processing chamber, the atmosphere Y also must be premixed, so as to avoid stratification of its gases.

The atmosphere X may be reactive, whereupon it may be or comprise oxygen. Thus, it may be a premixture of helium and oxygen. A premixture of helium and oxygen in equal mole fractions of 0.50 is advantageous, as it has a molecular weight of 18, which is the molecular weight of steam. Alternatively, it may comprise hydrogen.

The pressurizing atmosphere may be inert, whereupon it may be or comprise nitrogen, which is inert under many processing conditions of pertinent interest. Thus, it may be a premixture of helium and nitrogen. A premixture of helium in a mole fraction of 0.42 and nitrogen in a mole fraction of 0.58 also has a molecular weight of 18. Alternatively, it may be a premixture of inert gases, which may be noble gases, such as a premixture of helium and argon.

Neon has a molecular weight of 20, which is an approximation of the molecular weight of steam. Thus, it is contemplated by this invention that neon may be used as the pressurizing atmosphere, if the oxidizing atmosphere is steam.

BRIEF DESCRIPTION OF THE FIGURE

The FIGURE is a diagrammatic representation of an apparatus comprising a tubular vessel, which contains a boat holding silicon wafers to be oxidized, in which the process improved by this invention can be practiced, and which is shown to be connected to sources of a premixture of oxygen and helium, steam, and nitrogen, and to an exhaust.

DETAILED DESCRIPTION OF THE PREFERRED MODE

As shown, an apparatus 10, in which the process improved by this invention can be practiced in a preferred mode, comprises a tubular vessel 20, which has a removable cap 22, and which contains a boat 28 holding silicon wafers 30 to be oxidized, each wafer 30 being held in an edgewise, upright disposition. The removable cap 22 may be removed for insertion or withdrawal of the boat 28 and silicon wafers 30. The tubular vessel 20 is connected at an inlet 32 through a valve 34 to a source 36 of nitrogen, through a valve 44 to a source 46 of a premixture of helium and oxygen, and through a valve 54 to a source 56 of steam, which has been produced by boiling of deionized water. The valves 34, 44, and 54 are connected to the inlet 32 through a manifold 58. The tubular vessel 20 is connected at an outlet 62, which is provided in the removable cap 22, through a valve 64 to an exhaust 66. Suitable insulating, baffling, and heating measures, which reduce, control, or eliminate nonuniformity of temperature but which are outside the scope of this invention, may be employed. In other details, which are not critical to this invention, the apparatus 10 may accord with the apparatus disclosed in U.S. Pat. No. 4,253,417, which issued to the assignee hereof, and which is incorporated herein as a disclosure of those details.

As provided by the source 46, the premixture has equal mole fractions of helium and oxygen, 0.50 each, whereby the premixture has mean molecular weight of 18, which is the molecular weight of steam.

Before the boat 28 and silicon wafers 30 to be oxidized are inserted into the tubular vessel 20, the tubular vessel 20 is purged preliminarily with nitrogen, which floods the tubular vessel 20 at atmospheric pressure when the boat 28 and silicon wafers 30 are inserted into the tubular vessel 20.

After the tubular vessel 20 thus has been purged, and after the boat 28 and silicon wafers 30 to be oxidized thus have been inserted into the tubular vessel 20, the tubular vessel 20 is closed, whereupon the tubular vessel 20 is pressurized to a given pressure, which may range from 5 to 25 atmospheres, sequentially with nitrogen from the source 36 and with the premixture of helium and oxygen from the source 46. The premixture is introduced initially at a fast rate, so as to promote displacement of nitrogen from the tubular vessel 20, and subsequently at a slow rate, so as to conserve helium and oxygen. Thus, the premixture displaces nitrogen from the tubular vessel 20 except for a residual portion of nitrogen remaining with the premixture of helium and oxygen and diminishing in concentration with time. Oxygen being dry in the premixture effects slow oxidation of the wafers 30. Stratification between the residual portion of nitrogen and the premixture is insignificant because of the rapid, effective displacement of nitrogen by the premixture.

After the tubular vessel 20 has been pressurized with the premixture, the tubular vessel 20 is pressurized to the same pressure with steam from the source 56. Thus, steam displaces the premixture from the tubular vessel 20 except for a residual portion remaining with steam and diminishing in concentration with time. Because mean molecular weight of the premixture approximates the molecular weight of steam, stratification of gases in the tubular vessel 20 is minimized, so as not to contribute to nonuniform oxidation of the wafers 30.

After the tubular vessel 20 thus has been pressurized with steam, the tubular vessel 20 may be pressurized again to the same pressure with the premixture of helium and oxygen, whereupon stratification of the gases in the tubular vessel 20 again is minimized.

The given pressure, to which the tubular vessel 20 thus is pressurized sequentially with nitrogen, with the premixture of helium and oxygen, and with steam, typically may range from 5 to 25 atmospheres, which are regarded as high pressures, but is not critical to this invention. However, the same pressure is maintained in the tubular vessel 20 throughout its sequential pressurization with nitrogen, the premixture, steam, and so on. Conventional flow and pressure regulators (not shown) and other conventional means (not shown) cooperating with the valves 34, 44, 54, and 64 may be used to achieve, maintain, and monitor such a pressure.

Although high pressures are discussed above, the improvement of this invention is considered also to be useful at lower pressures including atmospheric pressure.

We claim:

1. In a process wherein silicon wafers are processed in a processing chamber, which is pressurized sequentially with an atmosphere X, and wherein an atmosphere Y displaces the atmosphere X except for a residual portion remaining with the atmosphere Y and diminishing in concentration with time, an improvement wherein the atmosphere X has a mean molecular weight substantially similar to a mean molecular weight of the atmosphere Y, in order to eliminate stratification of atmosphere X with respect to atmosphere Y during the period that atmosphere Y is displacing atmosphere X by causing a density of atmosphere X to be substantially equal to a density of atmosphere Y.

2. The improvement of claim 1 wherein the atmosphere Y is an oxidizing atmosphere.

3. The improvement of claim 2 wherein the oxidizing atmosphere comprises steam.

4. The improvement of claim 3 wherein the oxidizing atmosphere is steam.

5. The improvement of claim 1 wherein the atmosphere Y is a premixture of plural gases, which are not reactive with each other under the conditions found in the processing chamber.

6. The improvement of claim 1, 2, 3, 4, or 5 wherein the atmosphere X is composed of one gas of a molecular weight approximating the molecular weight of the atmosphere Y.

7. The improvement of claim 1, 2, 3, 4, or 5 wherein the atmosphere X is composed of plural gases in a premixture of mean molecular weight approximating the molecular weight of the atmosphere Y.

8. The improvement of claim 7 wherein the atmosphere X is reactive.

9. The improvement of claim 8 wherein the atmosphere X comprises oxygen.

10. The improvement of claim 8 wherein the atmosphere X is a premixture of helium and oxygen.

11. The improvement of claim 7 wherein the atmosphere X is inert.

12. The improvement of claim 11 wherein the atmosphere X comprises nitrogen.

13. The improvement of claim 11 wherein the atmosphere X comprises a noble gas.

14. The improvement of claim 11 wherein the atmosphere X is a premixture of noble gases.

15. The improvement of claim 7 wherein the atmosphere X comprises hydrogen.

16. The improvement of claim 7 wherein the atmosphere X comprises helium.

17. The improvement of claim 1 wherein the atmosphere Y is an oxidizing atmosphere of steam, and wherein the atmosphere X is neon.

18. The improvement of claim 7 wherein the atmosphere Y is steam, and wherein the atmosphere X is a premixture of helium and oxygen in equal mole fractions.

19. A process for treating silicon wafers in a gas processing chamber comprising the steps of loading one or more wafers into said processing chamber with said wafers having surfaces to be treated and said wafers being positioned so that portions of said wafer surfaces are displaced upwardly from other portions of said wafer surfaces; providing a first gas and a second gas for treating said wafers, said gases having differing mean molecular weights; mixing a third gas with one of said first and second gases to obtain first and second atmosphere gases respectively, which atmosphere gases have substantially similar mean molecular weights and densities; introducing said first atmosphere gas into said chamber and treating said wafer surfaces; and flowing said second atmosphere gas into said chamber to displace said first atmosphere gas therefrom and treating said wafer surfaces, said substantial similarity in mean molecular weights and densities being such as to permit displacement of said first atmosphere gas with no stratification of said atmosphere gases into layers in said chamber.

20. A process for treating silicon wafers in a gas processing chamber as defined in claim 19 wherein said first atmosphere gas introduced into said chamber has a substantially uniform concentration and said second atmosphere gas flowing into said chamber has a substantially uniform concentration.

21. A process for treating silicon wafers in a gas processing chamber as defined in claim 19 wherein said first gas and said second gas are reactant.

22. A process for treating silicon wafers in a gas processing chamber as defined in claim 19 wherein said third gas is inert.

23. A process for treating silicon wafers in a gas processing chamber as defined in claim 22 wherein said first and second gases are reactant.

24. A process for treating silicon wafers in a gas processing chamber as defined in claim 19 wherein said second atmosphere gas flowing into said gas processing chamber dilutes substantially uniformly said first atmosphere gas.

25. A process for treating silicon wafers in a gas processing chamber as defined in claim 19 wherein said first gas is comprised of oxygen, said second gas is comprised of steam and said third gas is comprised of helium.

* * * * *